United States Patent
Ormerod (10) Patent No.: US 6,316,864 B1
(45) Date of Patent: Nov. 13, 2001

(54) PIEZO-ELECTRIC ACTUATOR OPERABLE IN AN ELECTROLYTIC FLUID

(75) Inventor: William Ormerod, Hooksett, NH (US)

(73) Assignee: DEKA Products Limited Partnership, Manchester, NH (US)

( * ) Notice: Subject to any disclaimer, the term of this patent is extended or adjusted under 35 U.S.C. 154(b) by 0 days.

(21) Appl. No.: 09/605,927

(22) Filed: Jun. 28, 2000

Related U.S. Application Data (63) Continuation-in-part of application No. 09/188,942, filed on Nov. 10, 1998.
(60) Provisional application No. 60/065,369, filed on Nov. 12, 1997.

(51) Int. Cl.[7] .................................................... H01L 41/04
(52) U.S. Cl. ............................................ 310/328; 310/340
(58) Field of Search ..................................... 310/328, 330, 310/331, 332, 340

(56) References Cited

U.S. PATENT DOCUMENTS

| | | | | |
|---|---|---|---|---|
| 2,860,265 | * | 11/1958 | Mason | 310/328 |
| 3,598,506 | * | 8/1971 | O'Neill | 417/383 |
| 3,847,662 | * | 11/1974 | Massa | 134/1 |
| 4,011,474 | * | 3/1977 | O'Neill | 310/328 |
| 4,553,059 | | 11/1985 | Abe et al. | 310/328 |
| 4,565,942 | | 1/1986 | Sakai et al. . | |
| 4,933,919 | | 6/1990 | Geil et al. . | |
| 4,939,405 | | 7/1990 | Okuyama et al. . | |
| 5,148,177 | * | 9/1992 | Nagamune et al. | 342/124 |
| 5,355,048 | * | 10/1994 | Estes | 310/334 |
| 5,481,152 | * | 1/1996 | Buschulte | 310/328 |
| 5,731,048 | * | 3/1998 | Ashe et al. | 427/585 |
| 6,050,679 | * | 4/2000 | Howkins | 347/72 |
| 6,118,207 | * | 9/2000 | Ormerod et al. | 310/328 |

FOREIGN PATENT DOCUMENTS

| | | |
|---|---|---|
| 0 322 899 A2 | 7/1989 | (EP) . |
| WO 95/07820 | 3/1995 | (WO) . |

OTHER PUBLICATIONS

Japanese Patent Abstract 62046082, Mar. 6, 1984, Nippon Telegr & Teleph Corp.
Graf, Rudolf, *Radio* Shack Dictionary of Electronics, *4th Ed., Indiana*, Howard W. Sams & Co., Inc., 1972., p. 211.

* cited by examiner

*Primary Examiner*—Nestor Ramirez
*Assistant Examiner*—Peter Medley
(74) *Attorney, Agent, or Firm*—Bromberg & Sunstein LLP (57) ABSTRACT

A piezo-electric actuator operable in a fluid. The actuator has a piezo-electric element having one or more layers of piezo-electric material and electrodes adjacent to the piezo-electric material, the electrodes being coupled to electrical leads. A conductive layer surrounds the piezo-electric element, serving as a Faraday cage for shielding the fluid from effects due to electric fields within the conductive layer. A seal substantially impermeable to the fluid surrounds the piezo-electric element.

3 Claims, 5 Drawing Sheets

PIEZO-ELECTRIC ACTUATOR OPERABLE IN AN ELECTROLYTIC FLUID

The present application is a continuation-in-part application of U.S. Ser. No. 09/188,942, filed Nov. 10, 1998, now allowed, and claims priority from U.S. provisional application No. 60/065,369, filed Nov. 12, 1997, both of which applications are incorporated herein by reference.

TECHNICAL FIELD

The present invention relates to piezo-electric actuators, and more particularly, to piezo-electric benders that are operable in electrolytic fluids such as water.

BACKGROUND ART

A common application of piezo-electric actuators is for controlling fluid flow through a valve. Piezo-electric actuators such as benders are typically made from layers of piezoceramic material (such as lead zirconate titanate, for example) stacked between conducting electrodes, typically metal, across which electric potentials are applied for creating electric fields across the piezoceramic layers.

Piezo-electric benders, when used to control fluid flow, are typically isolated from the fluid to prevent corrosion and chemical attack by the fluid on the metal and piezoceramic layers. One failure mode of piezo-electric benders immersed in water is the growth of metallic dendrites through the ceramic layers with subsequent shorting together of the conducting layers. Even if the bender is coated, water may interact corrosively with the coating and cause its breakdown.

Accordingly, it is desirable to develop a configuration permitting a piezo-electric actuator to work immersed in water or other electrolytic fluid.

SUMMARY OF THE INVENTION

The present invention, in one embodiment, is directed to a piezo-electric actuator operable in a fluid. The piezo-electric actuator has an interior electrode and one or more exterior electrodes. Each of the exterior electrodes is kept at a constant electrical potential, while electrical circuitry switches the electrical potential of the interior electrode. A seal is provided surrounding the piezo-electric element that is substantially impermeable to the fluid.

In alternate embodiments of the invention, the constant electrical potential of the exterior electrodes is electrical ground. There may be more than one group of interior electrodes, and a circuit may be provided for applying differential electrical potential between or among the groups.

In accordance with another aspect of the present invention, there is provided a method for activating a piezo-electric actuator that has an interior electrode and one or more exterior electrodes. The method includes the steps of sealing the actuator from the fluid by means of a seal substantially impermeable to the fluid, maintaining the at least one exterior electrode at a fixed electrical potential, and applying an electrical potential to the interior electrode with respect to the at least one exterior electrode. Alternatively, a plurality of exterior electrodes may be provided, with the method comprising sealing the actuator from the fluid by means of a seal substantially impermeable to the fluid, maintaining constant the electrical potential of each exterior electrode, and applying an electrical potential to the interior electrode with respect to the exterior electrodes.

DETAILED DESCRIPTION OF SPECIFIC EMBODIMENTS

Figure 1A:
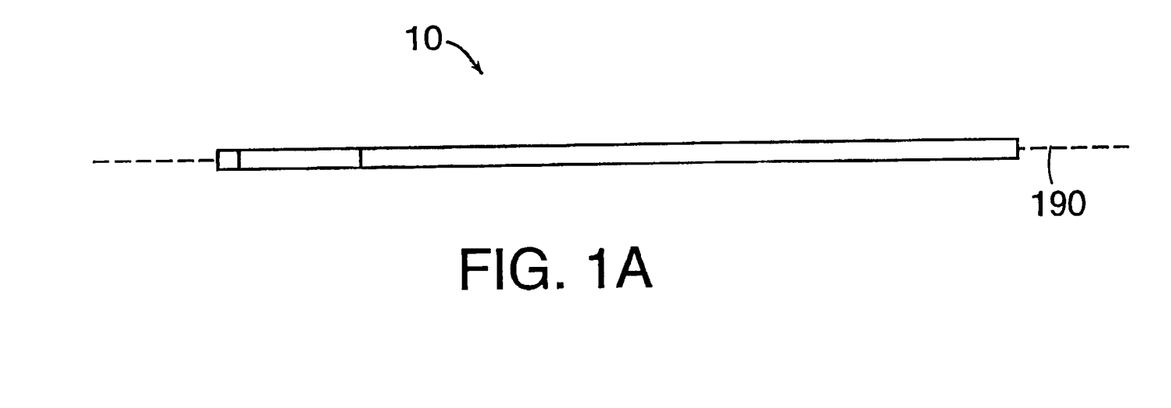
FIG. 1A is a side view of a non-activated piezo-electric bender in accordance with one embodiment of the present invention.
Figure 1B:
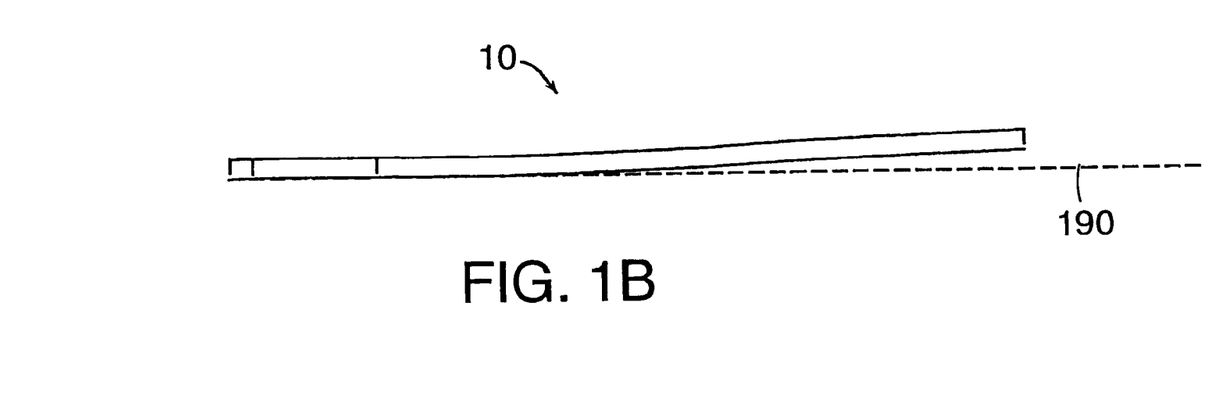
FIG. 1B is a side view of the piezo-electric bender shown in FIG. 1A as activated.

FIGS. 1A–B illustrate a piezo-electric bender 10 in accordance with one embodiment of the present invention. The bender 10, as shown in FIG. 1A, is relaxed and inactivated, while FIG. 1B shows bender 10 in its activated, or bent, state. Bending is achieved by application of an electric field across layers of piezoceramic material, as discussed now with reference to FIGS. 2A–2C.

In accordance with certain embodiments of the invention, two piezo-electric layers may be configured as a bi-layer, with electrodes disposed between the two piezo-electric layers and exterior to each of the layers. Accordingly, the term "multi-layer", as used in this description and in any appended claims, will encompass any number greater than one of layers of piezo-electric material. Use of a single layer of piezo-electric material for an actuator operable in a fluid is similarly within the scope of the present invention.

If the piezo-electric bender is exposed to water or to another polar fluid, the fluid may be electrolyzed due to potentials applied to the bender electrodes. Accordingly, it is desirable to shield any fluid immediately adjoining the outer surface of the piezo-electric bender from electric fields generated within the bender.

Figure 2A:
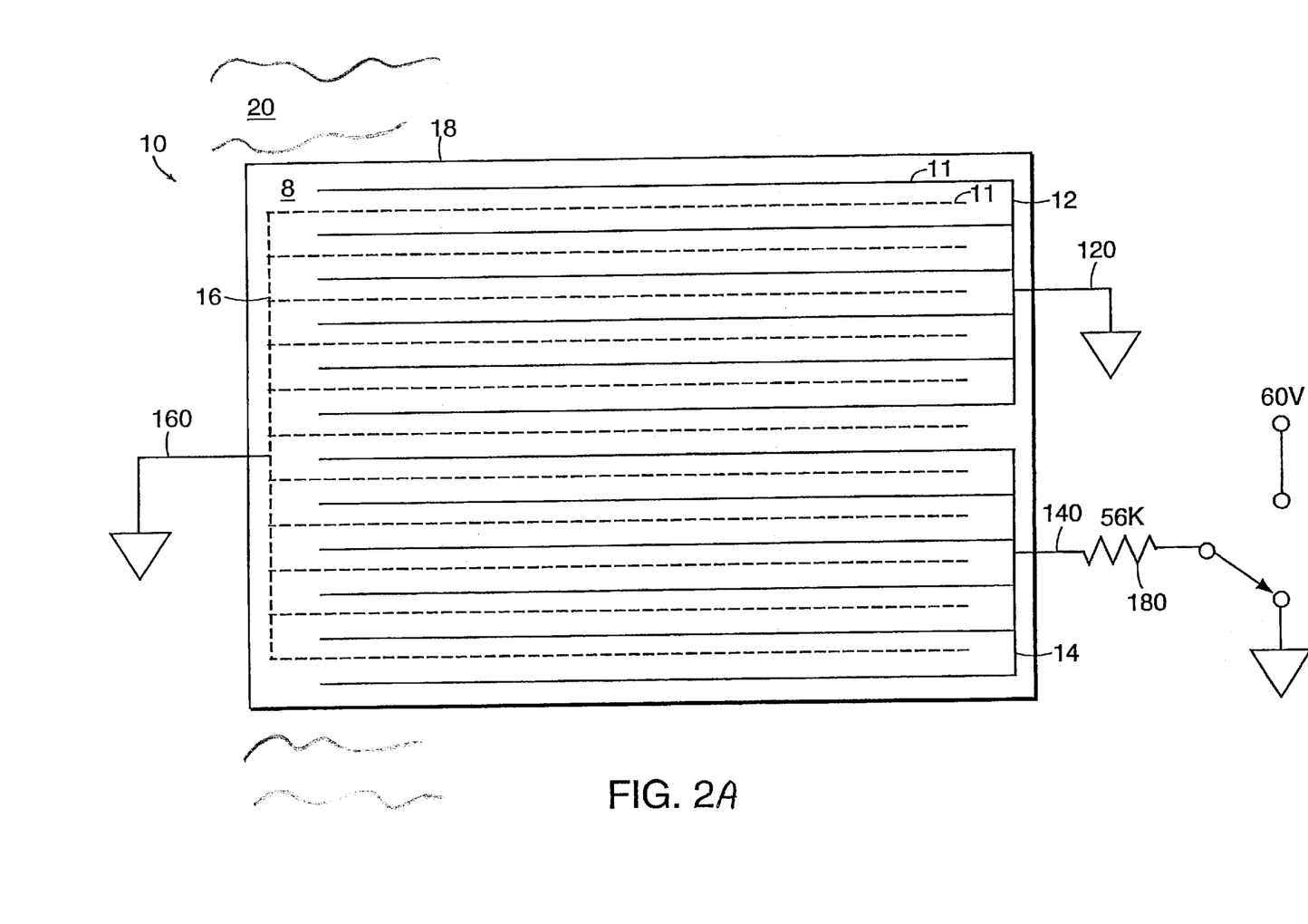
FIG. 2A is a schematic representing a cross section of the piezo-electric bender of FIG. 1A, showing one connection of electrodes to external contacts in accordance with one embodiment of the present invention.

As shown in FIG. 2A, the piezoceramic bender 10 comprises a piezoceramic material 8 interleaved by a plurality of electrode layers 11 aligned in an alternating pattern. The electrode layers 11 are made of a conducting material, typically metal, the application of which to piezoceramic material 8 is well known in the art. In one arrangement of electrode layers 11, shown here by way of example only, an upper group 12 of electrodes is electrically interconnected, as is a lower group 14 of electrodes, as is also a third and inner group 16 of electrodes. The electrodes are interleaved such that one electrode from inner group 16 is disposed between any two adjacent electrodes of both upper group 12 and lower group 14. An example of a piezo-electric bender having the electrode configuration shown is Phillips bender, model number P/N 9922 531 50026, manufactured by Phillips Components in Roermond, the Netherlands. The aforesaid Phillips bender has twenty two (22) active piezo-electrode layers. One example of electrical connection is shown in FIG. 2A. Conductive contact 120 is electrically coupled to all of the upper group 12 of electrodes while conductive contact 140 is electrically coupled to all of the lower group 14 of electrodes. Similarly, conductive contact 160 is electrically coupled to all of the inner group 16 of electrodes. Conductive contacts 120, 140, and 160 provide for connection of the respective electrodes to external circuitry. A fluid 20 is shown in which bender 10 may be immersed.

In the mode of operation of bender 10 depicted in FIG. 2A, contacts 120 and 160 are connected to ground, and contact 140 may be switched either to a 60V potential or to ground, in either case via a current-limiting series resistor 180. When contact 140 is connected to ground, the piezo-electric bender 10 is in its non-activated state (FIG. 1A), wherein the bender 10 remains substantially parallel to a longitudinal axis 190. When contact 140 is connected to the 60V potential, piezo-electric bender 10 becomes activated and bent with respect to longitudinal axis 190, in the manner shown in FIG. 1B.

Figure 2B:
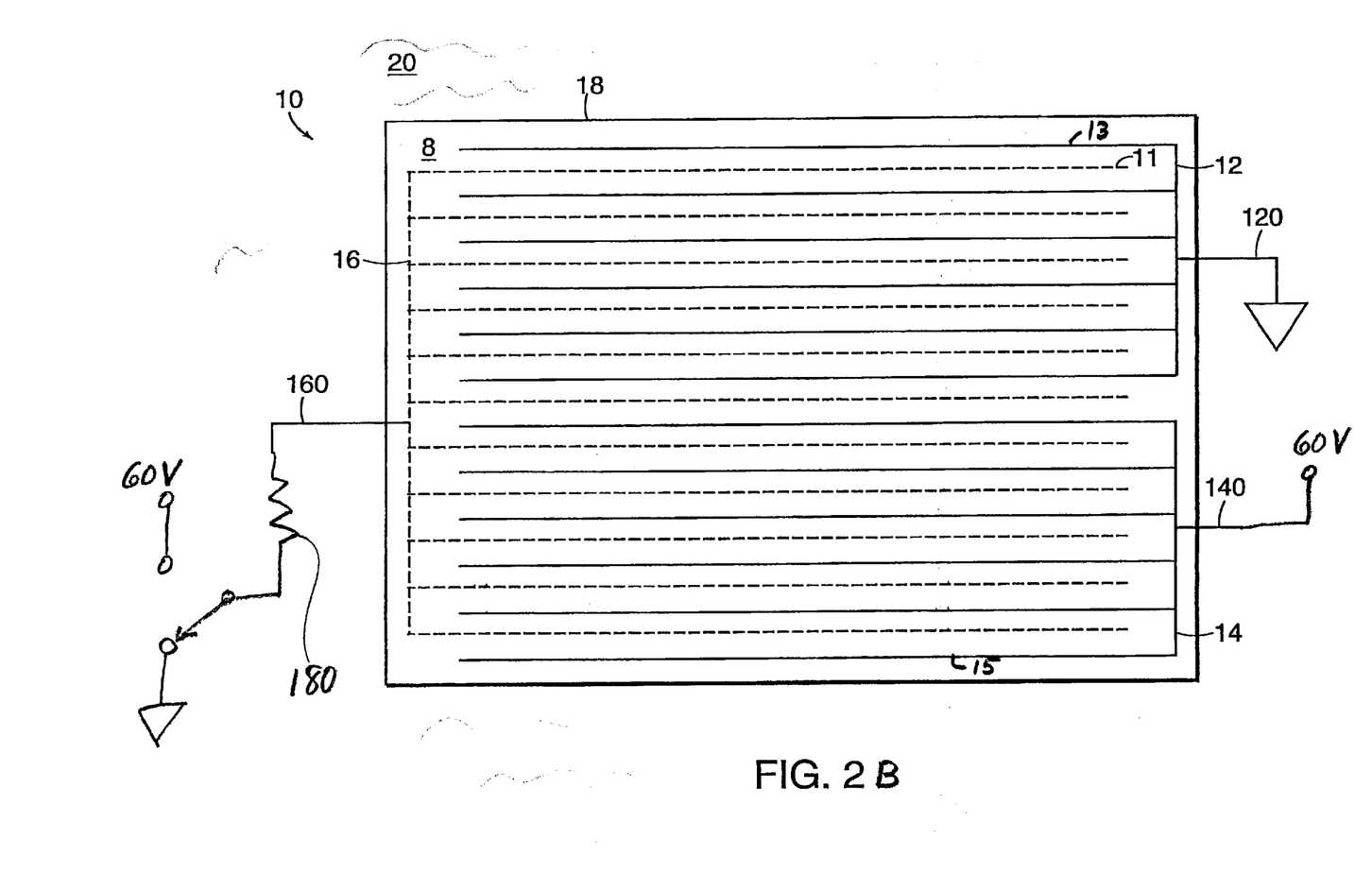
FIG. 2B is a schematic representing a cross section of the piezo-electric bender of FIG. 1A, showing connection of electrodes to external contacts in accordance with another embodiment of the present invention.

A preferred method for applying electrical potentials to the respective electrodes of bender 10 is shown in FIG. 2B. In the configuration shown, both upper group 12 and lower group 14 of electrodes are maintained at constant potentials. Upper group 12 is grounded, while lower group 14 is maintained at a fixed non-zero potential, shown, for purposes of illustration, as +60 V. By virtue of the fact that, in each case, outermost electrodes, 13 and 14, are maintained at fixed (but different) potentials, electrical current is not induced between the bender 10 and surrounding fluid 20 advantageously reducing corrosion as described above. The common group 16 of electrodes is interior and may be switched by circuitry 162, between ground and a fixed or varying potential, shown for purposes of illustration as 60 V. Current-limiting resistor 180 is shown in series with the switched electrode.

Alternatively, in accordance with further embodiments of the invention, a free-standing electrode may be provided between the external electrode and the fluid, with the free-standing electrode either tied to ground contact 120 or to a separate contact that is also grounded.

Figure 2C:
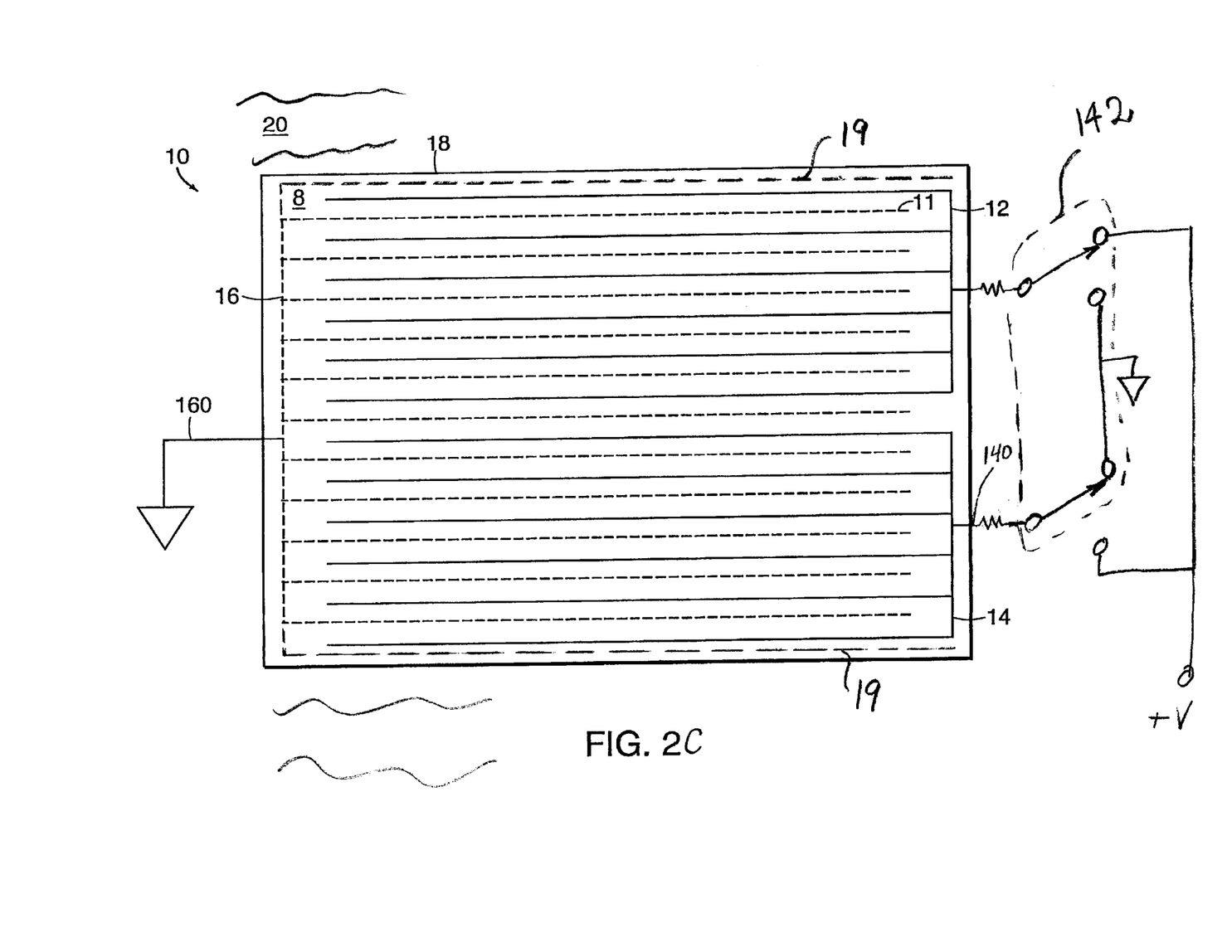
FIG. 2C is a schematic representing a cross section of the piezo-electric bender of FIG. 1A, showing a connection of electrodes to external contacts in accordance with yet a further embodiment of the present invention.

An alternate method for applying electrical potentials to the respective electrodes of bender 10 is shown in FIG. 2C. In accordance with the embodiment shown, common electrode group 16 includes both outer electrodes 19. Outer electrodes 19 are maintained at a fixed potential, preferably ground, such that currents are not induced between bender 10 and surrounding fluid 20, whether on startup when electrical potentials are first applied to groups of electrodes 12 and 14, nor upon subsequent switching of the potentials of groups of electrodes 12 and 14. Switch 142, or any equivalent structure, may be used to apply an electrical potential, shown for example as +V, to one or the other set, 12 or 14, of inner electrodes, thereby causing bender 10 to bend. Fringing electric fields, however, may still escape from the piezo-bender edges into the fluid region.

In accordance with a preferred embodiment of the invention, a conductive coating 18 is provided over the entirety of bender 10 to create a Faraday shield. A Faraday shield, as known to persons of ordinary skill in the electrical arts, is a conducting enclosure which, by virtue of its equipotential surface, shields its exterior from the effect of any field sources within the conducting enclosure. Thus, no electric field will be present in the region 20 exterior to conductive coating 18 due to potentials applied within conductive coating 18. Any conductive coating 18, applied using any technique of deposition, is within the scope of the present invention. Conductive coating 18 is preferably non-porous, so that no fluid may enter within the region enclosed by the conductive coating. Alternatively or additionally, conductive coating 18 may, in turn, be coated by another coating, of a non-porous material to prevent entry of fluid into the region enclosed by the conductive coating.

The composition of conductive coating 18 may be a metal alloy, a gel, or any other conductive material. A fluid barrier, for instance, a hydrophobic composition such as parylene can be applied to prevent fluid from entering the region inside of the Faraday shield.

Figure 3A:
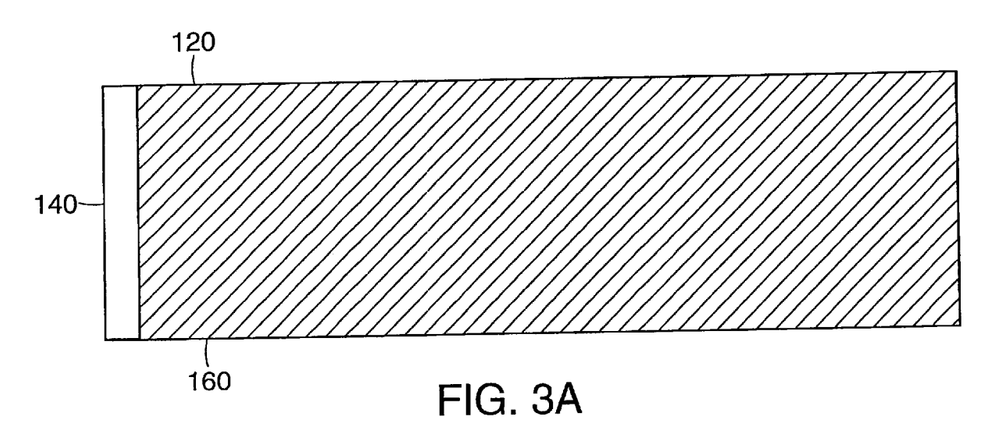
FIGS. 3A–C are top, side, and end views of a piezo-electric bender in accordance with an embodiment of the present invention.
Figure 3B:
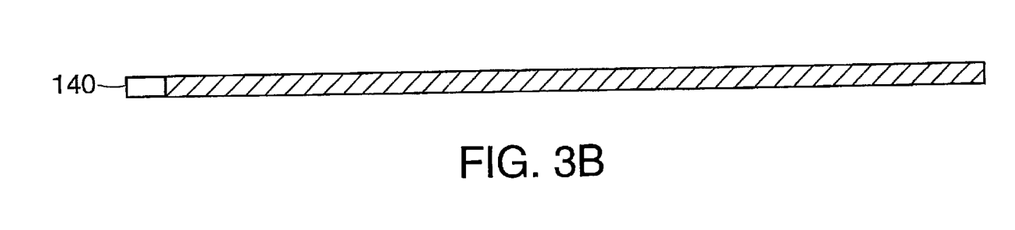
Figure 3C:
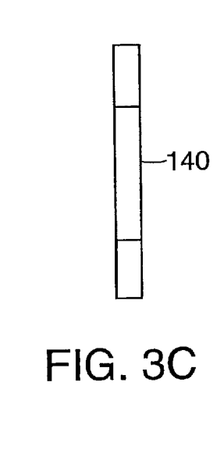

FIGS. 3A–C illustrate top, side and end views of piezo-electric bender 10 of FIGS. 2A–2C. Contacts 120, 140, and 160, connected, respectively, as described above, to the upper group 12, lower group 14 and common group 16 of electrodes, as shown in FIGS. 2A–2C, are shown as they appear at the exterior of the bender assembly. In accordance with the various embodiments of the invention described above, contacts 160 and 120, connected to the interior and upper groups of electrodes, respectively, may both be grounded. Thus, electrical fields created between electrodes of the actuator are terminated within the device, other than for fringing effects. The surrounding medium is thus effectively shielded from fields created within the actuator.

In accordance with another embodiment of the invention, contacts 120 and 160 may be extended, by any known means of creating a conducting coating, to cover the entire exterior of the piezo-electric actuator. This has the effect of generating a Faraday shield enclosing the entire device, as discussed above. Means are provided, in accordance with an embodiment of the invention, to bring out a lead connected to contact 140, in order to apply a voltage potential with respect to the common ground connection of contacts 120 and 160. Since electric fields generated within the actuator are shielded, in the manner described, from the surrounding medium, electrolysis of the medium may be eliminated, thereby reducing the amount of corrosion to the device.

In order for the conductive coating 18 to act as a Faraday shield, shielding electric fields from penetrating the surrounding fluid, it is important to exclude the fluid from the region interior to the conductive coating. As a result, a substantially non-porous coating may be provided to exclude fluid from the interior of the shield. In one embodiment of the invention the electrically conductive coating 18 may act as the non-porous coating. Alternatively or additionally, a layer of a fluid barrier, for instance, a hydrophobic composition such as parylene, can also be applied about the coating 18 to further prevent water leakage or migration to the interior of the conductive coating.

While the invention has been described in connection with specific embodiments thereof, it will be understood that it is capable of further modification. In particular, each of the contacts may be moved to a location along the bender 10 different from that shown in FIGS. 3A–C, so as to facilitate coating of the non-porous hydrophobic composition onto the bender. Modifications in the composition of the coating or the number of coatings may also be made. Additionally, use of the piezo-electric element as a sensor is within the scope of the invention and of the appended claims.

What is claimed is:

1. A piezo-electric actuator operable in a fluid, the actuator comprising:

a piezoelectric element having a plurality of groups of interior electrodes and at least one exterior electrode, each exterior electrode being at a constant electrical potential;

electrical circuitry for switching an electrical potential of at least one interior electrode; and a seal surrounding the piezoelectric element, the seal being substantially impermeable to the fluid.

2. A piezo-electric actuator according to claim 1, further comprising an electrical circuit for applying a differential electrical potential between or among the more than one group of interior electrodes.

3. A method for activating a piezo-electric actuator for operation in a fluid, the piezo-electric actuator having an interior electrode and a plurality of exterior electrodes, the method comprising:

sealing the actuator from the fluid by means of a seal substantially impermeable to the fluid;

maintaining constant the electrical potential of each exterior electrode; and applying an electrical potential to the interior electrode with respect to the exterior electrodes.

* * * * *

UNITED STATES PATENT AND TRADEMARK OFFICE
CERTIFICATE OF CORRECTION

PATENT NO. : 6,316,864 B1
DATED : November 13, 2001
INVENTOR(S) : William W. Ormerod It is certified that error appears in the above-identified patent and that said Letters Patent is hereby corrected as shown below:

Drawing Sheets 1-5 consisting of Figures 1A, 1B, 2A, 2B, 2C, 3A, 3B should be deleted and replaced with sheets 1-5 as attached on the following pages.

Signed and Sealed this

Twenty-eighth Day of October, 2003

JAMES E. ROGAN
*Director of the United States Patent and Trademark Office*